US012438341B2

(12) United States Patent
Seurin et al.

(10) Patent No.: US 12,438,341 B2
(45) Date of Patent: Oct. 7, 2025

(54) ILLUMINATION DEVICE

(71) Applicant: ams Sensors Asia Pte. Ltd., Singapore (SG)

(72) Inventors: Jean-Francois Seurin, Princeton Junction, NJ (US); Baiming Guo, Old Bridge, NJ (US); Markus Rossi, Jona (CH); Anderson Singulani, Graz (AT)

(73) Assignee: AMS SENSORS ASIA PTE. LTD., Singapore (SG)

( * ) Notice: Subject to any disclaimer, the term of this patent is extended or adjusted under 35 U.S.C. 154(b) by 1088 days.

(21) Appl. No.: 17/278,127

(22) PCT Filed: Sep. 23, 2019

(86) PCT No.: PCT/IB2019/001014
§ 371 (c)(1),
(2) Date: Mar. 19, 2021

(87) PCT Pub. No.: WO2020/065391
PCT Pub. Date: Apr. 2, 2020

(65) Prior Publication Data
US 2022/0131345 A1    Apr. 28, 2022

Related U.S. Application Data

(60) Provisional application No. 62/735,367, filed on Sep. 24, 2018.

(51) Int. Cl.
*H01S 5/183* (2006.01)
*G01B 11/24* (2006.01)
(Continued)

(52) U.S. Cl.
CPC .......... *H01S 5/18388* (2013.01); *G01B 11/24* (2013.01); *G01S 7/4815* (2013.01);
(Continued)

(58) Field of Classification Search
None
See application file for complete search history.

(56) References Cited

U.S. PATENT DOCUMENTS

| 3,438,200 A | 4/1969 | Jennings et al. |
| 7,502,176 B2 * | 3/2009 | Mino ................. G02B 19/0057 372/9 |

(Continued)

FOREIGN PATENT DOCUMENTS

| CN | 1651972 A | 8/2005 |
| CN | 104022433 A | 9/2014 |

(Continued)

OTHER PUBLICATIONS

International Search Report for corresponding International Application No. PCT/IB2019/001014 mailed Jan. 28, 2020.

(Continued)

*Primary Examiner* — Yuqing Xiao
*Assistant Examiner* — Jempson Noel
(74) *Attorney, Agent, or Firm* — Viering, Jentschura & Partner mbB

(57) ABSTRACT

A device comprising: an illumination device for emitting an illumination beam, the illumination device comprising: an emitter array comprising multiple light emitters; and a meta-structure or micro-prism array comprising multiple transmission areas, the meta-structure of micro-prisms being positioned to receive light emitted from the emitter array, in which light from the meta-structure of micro-prism forms the illumination beam, in which a first one of said multiple transmission areas is arranged to emit light in a different direction than a second one of said multiple transmission areas.

42 Claims, 12 Drawing Sheets

(51) Int. Cl.
  *G01S 7/481*     (2006.01)
  *G01S 17/89*     (2020.01)
  *G02B 3/00*      (2006.01)
  *G02B 19/00*     (2006.01)
  *H01S 5/02253*   (2021.01)
  *H01S 5/42*      (2006.01)
  *H04N 23/56*     (2023.01)

(52) U.S. Cl.
  CPC ............ *G01S 17/89* (2013.01); *G02B 3/0006* (2013.01); *G02B 19/0057* (2013.01); *H01S 5/02253* (2021.01); *H01S 5/18305* (2013.01); *H01S 5/18386* (2013.01); *H01S 5/423* (2013.01); *H04N 23/56* (2023.01)

(56) References Cited

U.S. PATENT DOCUMENTS

| | | | |
|---|---|---|---|
| 8,761,594 B1* | 6/2014 | Gross | G01S 7/4817 |
| | | | 396/155 |
| 9,048,633 B2* | 6/2015 | Gronenborn | H01S 5/423 |
| 9,273,846 B1* | 3/2016 | Rossi | G02B 3/005 |
| 9,946,089 B2* | 4/2018 | Chen | F21V 5/008 |
| 10,855,055 B2* | 12/2020 | Bloemen | H01S 5/0267 |
| 11,512,836 B2* | 11/2022 | Rossi | G02B 27/20 |
| 2004/0233964 A1* | 11/2004 | Yamanaka | G02B 27/0961 |
| | | | 372/108 |
| 2007/0071056 A1 | 3/2007 | Chen | |
| 2008/0310186 A1 | 12/2008 | Chari et al. | |
| 2011/0254763 A1 | 10/2011 | Lee et al. | |
| 2013/0272330 A1 | 10/2013 | Joseph et al. | |
| 2014/0247841 A1 | 9/2014 | Seurin et al. | |
| 2014/0269796 A1* | 9/2014 | Geske | H01S 5/4087 |
| | | | 372/34 |
| 2016/0164261 A1* | 6/2016 | Warren | H04N 23/11 |
| | | | 372/50.122 |
| 2016/0352073 A1 | 12/2016 | Dummer et al. | |
| 2017/0097274 A1 | 4/2017 | Thorpe et al. | |
| 2017/0115447 A1* | 4/2017 | Miyamoto | G02B 19/0009 |
| 2017/0207374 A1* | 7/2017 | Gubser | H10K 50/84 |
| 2017/0370554 A1 | 12/2017 | MacKinnon et al. | |
| 2018/0129013 A1* | 5/2018 | Balimann | G02B 19/0014 |
| 2018/0150695 A1* | 5/2018 | Guttmann | G06V 20/40 |
| 2018/0259645 A1* | 9/2018 | Shu | G01S 7/4865 |
| 2019/0243155 A1* | 8/2019 | You | G02B 27/4233 |
| 2020/0025893 A1* | 1/2020 | Jang | H01S 5/18344 |
| 2020/0194975 A1* | 6/2020 | Gronenborn | H01S 5/02253 |

FOREIGN PATENT DOCUMENTS

| | | |
|---|---|---|
| DE | 6608740 U | 11/1971 |
| KR | 10-1275388 B1 | 6/2013 |
| WO | 9740558 A1 | 10/1997 |
| WO | 0205397 A2 | 1/2002 |
| WO | 2018-063220 A1 | 4/2018 |

OTHER PUBLICATIONS

International Preliminary Report on Patentability issued for related Application No. PCT/IB2019001014 dated Apr. 1, 2021 (10 Pages).
International Search Report issued for the corresponding International Application No. PCT/SG2019/050483, dated Dec. 9, 2019, 3 pages (for informational purposes only).
US search report issued for the parallel U.S. Appl. No. 17/278,511, dated May 29, 2024, 1 page (for informational purposes only).

* cited by examiner

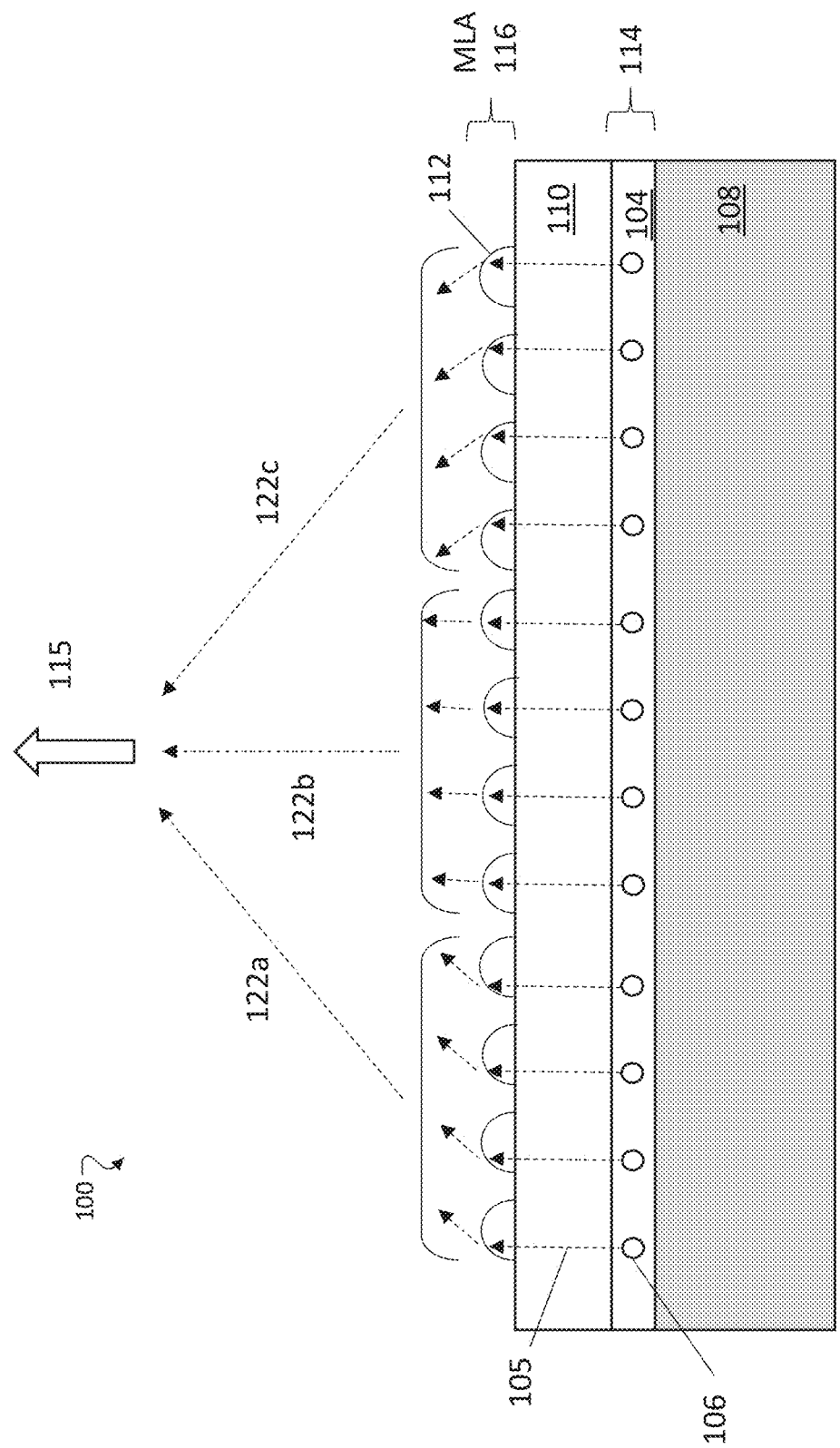

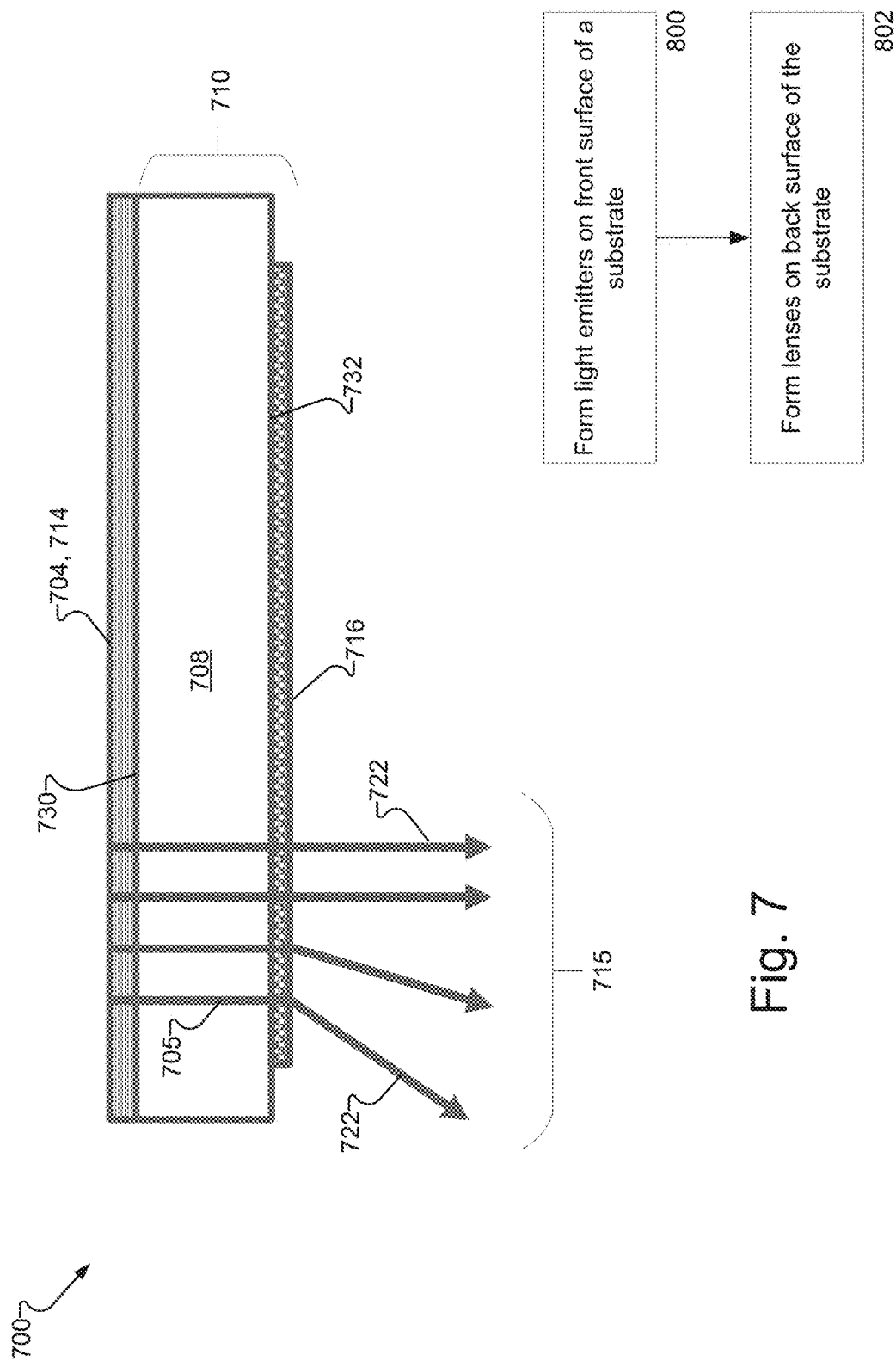

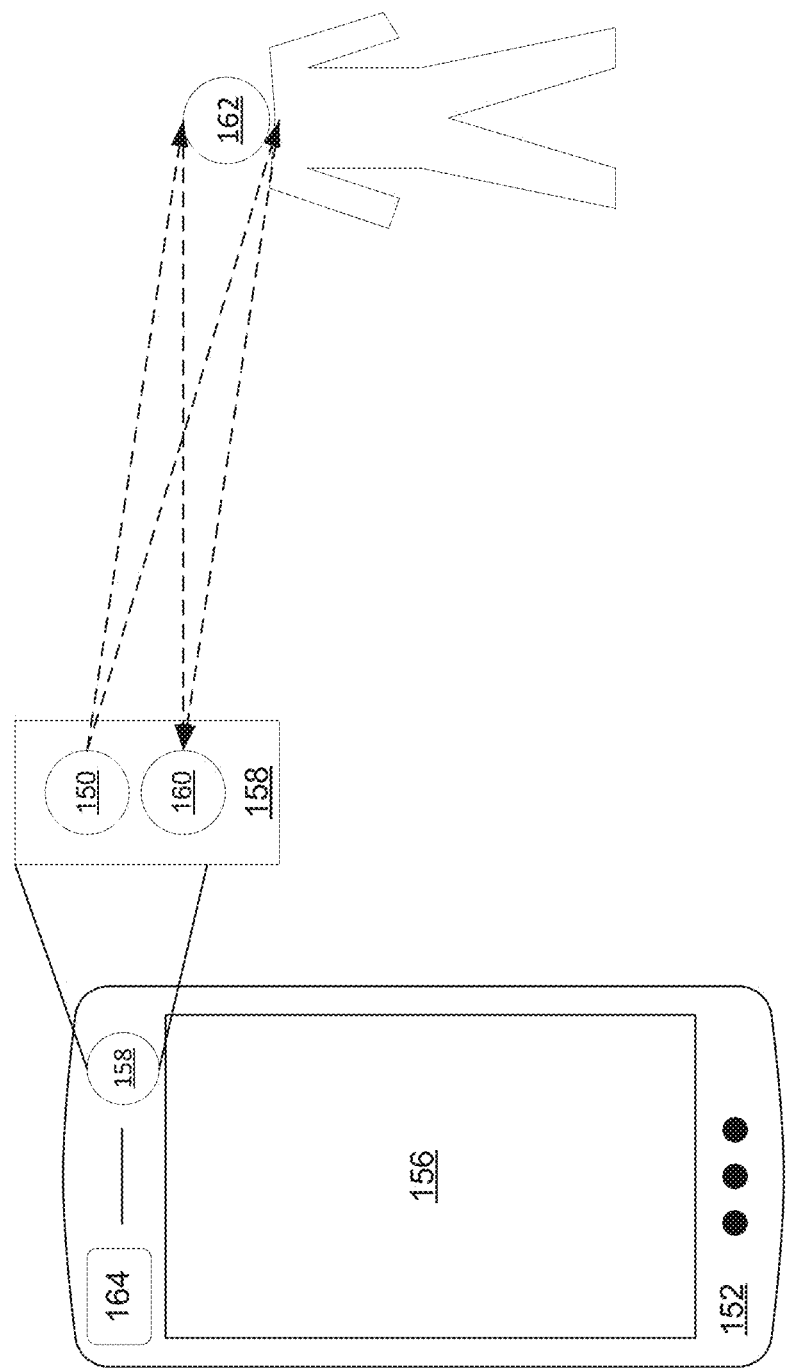

ILLUMINATION DEVICE

CROSS-REFERENCE TO RELATED APPLICATION

This PCT International patent application claims priority and benefit to U.S. Provisional Patent Application Ser. No. 62/735,367, which was filed on Sep. 24, 2018. The content of the disclosure is hereby incorporated by reference in its entirety for all purposes.

BACKGROUND

Micro-structures or micro-prisms can be used in optical devices.

SUMMARY

The invention provides a device, methods and an imaging system as set out in the accompanying claims.

BRIEF DESCRIPTION OF DRAWINGS

FIGS. 1A and 1B are diagrams of an illumination device.
FIG. 7 is a diagram of an illumination device.
FIG. 8 is a flow chart.
FIGS. 10A and 10B are diagrams of mobile computing devices.

DETAILED DESCRIPTION

Figure 1B:
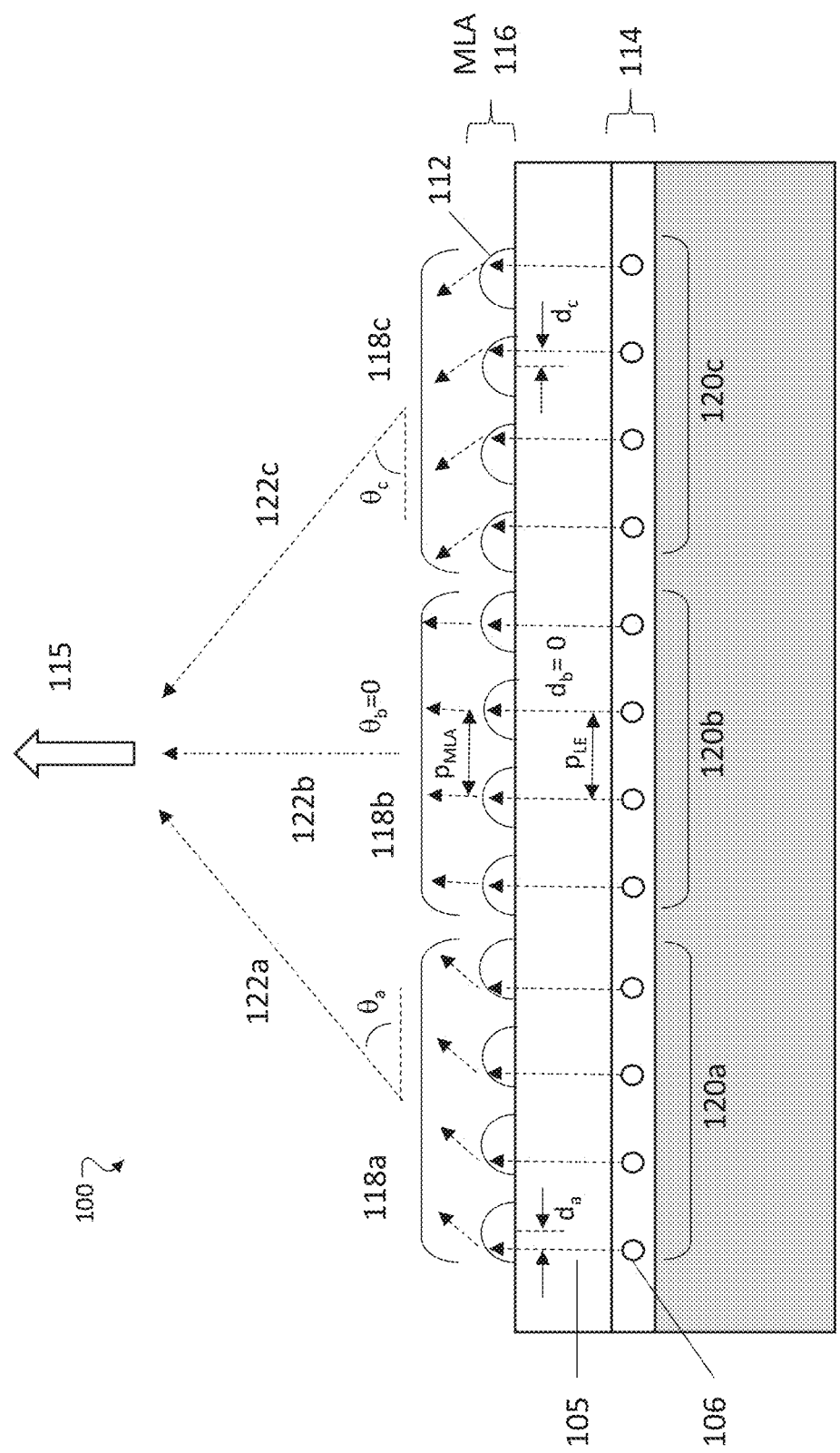

We describe here a compact illumination device for producing an illumination beam with a broad divergence and a substantially uniform intensity and low variation in power across its width. The illumination device includes an array of light emitters, such as vertical-cavity surface-emitting lasers (VCSELs), and a micro-lens array to receive and deflect the light emitted by the light emitters. Regions of the micro-lens array are differently offset relative to the array of light emitters, resulting in the generation of multiple sub-beams with different angles of deflection. The multiple sub-beams combine to form the divergent illumination beam.

Referring to FIG. 1A, an illumination device 100 for producing a divergent illumination beam 115 includes an emission layer 104 that includes semiconductor-based light emitters 106, such as semiconductor lasers, e.g., VCSELs or side-emitting semiconductor lasers; or diodes, such as laser diodes or light emitting diodes (LEDs). Each light emitter 106 emits light 105, such as a light beam, e.g., visible light, infrared light, or ultraviolet light. The emission layer 104 can be formed on a substrate 108, such as a portion of a semiconductor wafer, e.g., a silicon wafer, gallium arsenide (GaAs) wafer, aluminum gallium arsenide (AlGaAs), indium phosphide (InP), or other type of wafer.

An optical layer 110 including lenses 112 or other optical elements is disposed on the emission layer 104. For instance, the optical layer 110 can be a thin film deposited or grown (e.g., epitaxially grown) on the emission layer 104 (as shown in FIG. 1) or can be a portion of the substrate 108 in which the lenses 112 are formed. The thin film nature of the optical layer enables the illumination device 100 to be compact. The optical layer 110 is formed of a material that is at least partially transparent to the light 105 emitted by the light emitters 106. For instance, the optical layer 110 can be a transparent polymer, such as benzocyclobutene (BCB, also known as cyclopentane) (Dow Chemical) or HD8910 (DuPont); or a transparent semiconductor, such as GaAs.

The lenses 112 are positioned to receive and deflect at least some of the light 105 emitted by the light emitters 106, forming a single illumination beam 115 from the illumination device 100. The illumination beam 115 can be a broad angle illumination beam having a divergence greater than the divergence of the light 105 emitted by the light emitters 106. For instance, the divergence at full width at half maximum (FWHM) of the light 105 emitted by the light emitters 106 can be about 10-20 degrees, and the divergence at FWHM of the illumination beam 115 can be about 20-180 degrees, e.g., about 50-90 degrees, e.g., about 60-70 degrees. In some examples, the divergence of the illumination beam 115 can vary by direction. For instance, the divergence of the illumination beam 115 in a first direction can be about 50-60 degrees, e.g., about 55 degrees, and the divergence of the illumination beam 115 in a second direction (e.g., perpendicular to the first direction) can be about 60-70 degrees, e.g., about 65 degrees.

The greater divergence of the illumination beam 115 can be achieved by arranging the lenses 112 such that the positioning of the lenses 112 relative to the light emitters 106 varies across the illumination device 100. As discussed further below, the different relative positioning between the lenses 112 and the light emitters 106 results in the creation of multiple sub-beams 122, each sub-beam having a different angle of deflection. The multiple sub-beams combine into the single illumination beam 115, with the broad divergence of the illumination beam 115 being enabled by the differing angles of deflection of the constituent sub-beams.

In some examples, the light emitters 106 are arranged in an array 114, such as a one-dimensional array or a two-dimensional array, such as a square array, a rectangular array, a hexagonal array, or an array of another geometry. The lenses 112 are arranged in an array 116, sometimes referred to as a micro-lens array (MLA) 116. The MLA 116 can be a one-dimensional array (as shown in FIG. 1) or a two-dimensional array, such as a square array, a rectangular array, a hexagonal array, or an array of another geometry. In the example of FIG. 1A, the array 114 of light emitters 106 is a one-dimensional array of pitch $p_{LE}$ and the MLA 116 is a one-dimensional array of pitch $p_{MLA}$ (see FIG. 1B). The pitch $p_{MLA}$ of the MLA 116 and the pitch $p_{LE}$ of the array 114 of light emitters can be equal to or larger than a diameter of the lenses 112 in the MLA 116.

FIG. 1B is an annotated view of the illumination device 100 of FIG. 1. The MLA 116 has multiple regions 118a, 118b, 118c (referred to collectively as regions 118), with the lenses 112 in each region 118a, 118b, 118c positioned to receive light from a corresponding subset 120a, 120b, 120c of the light emitters 106. Each of the regions 118a, 118b, 118c is offset from the corresponding subset 120a, 120b, 120c of the light emitters 106 by an offset $d_a$, $d_b$, $d_c$. An offset between a region 118 of the MLA 116 and a corresponding subset 120 of the light emitters is the lateral distance between the center of a lens and the center of the corresponding light emitter. The offset of at least one of the regions 118 is different from the offsets of the other regions. In some examples, all of the offsets $d_a$, $d_b$, $d_c$ are different.

In some examples, at least one of the offsets is zero, meaning that there is no offset between one of the regions of the MLA 116 (here, region 118b) and the corresponding subset 120b of the light emitters 106. We sometimes refer to an MLA 116 in which at least one region 118 is offset from the corresponding subset 120 of light emitters 106 as being an MLA that is offset from the array of light emitters. The offset between the MLA 116 and the array 114 of light emitters can be such that each of the lenses 112 in the MLA 116 at least partially overlaps a corresponding light emitter 106 (as shown in FIG. 1B), or at least partially overlaps multiple corresponding light emitters 106.

The lenses 112 in the MLA 116 deflect the light 105 emitted by the light emitters 106 to form the illumination beam 115. The angle of deflection θ of each sub-beam depends at least on the offset between the MLA 116 and the array 114 of light emitters 106. When different regions 118 of the MLA 116 have different offsets, each region 118a, 118b, 118c deflects the light 105 emitted by the corresponding subset 120a, 120b, 120c of light emitters 106 differently, forming sub-beams 122a, 122b, 122c (collectively referred to as sub-beams 122) each directed at a different angle of deflection $\theta_a$, $\theta_b$, $\theta_c$. Each sub-beam 122 has a more uniform intensity and less power variation across the width of the sub-beam than the constituent beams 105 emitted by the light emitters.

The sub-beams 122 combine to form the illumination beam 115. The different angles of deflection of the sub-beams 122 produce a broadly divergent illumination beam 115 with a substantially uniform intensity and with little variation in power across its width. The illumination beam 115 can also have a relatively steep rollover at the edges of the beam.

The angle of deflection θ at which the sub-beams 122 are directed is dependent on the offset between the regions 118 of the MLA 116 and the corresponding subsets 120 of light emitters 106. The angle of deflection is also dependent on the index of refraction of the optical layer 110. A higher index of refraction enables a larger angle of deflection to be achieved. In some examples, the optical layer 110 can have a refractive index of at least 1, e.g., between about 1 and about 1.8, e.g., between about 1.5 and about 1.8.

In some examples, each sub-beam 122 is individually controllable, e.g., by addressing the corresponding subset 120 of light emitters 106, enabling control over the configuration of the resulting illumination beam.

In a specific example, the light emitters 106 are VCSELs having a diameter of 7.5 μm and arranged in an array 114 with a pitch of 28 μm (e.g., the center-to-center distance of adjacent VCSELs is 28 μm). The lenses 112 in the MLA 116 have a diameter of 25 μm and a height of 8 μm. Each lens 112 in the MLA 116 is offset from its corresponding VCSEL by an offset of 8.5 μm. In general, the offset between lenses 112 and corresponding light emitters can be less than about 10 μm, e.g., about 5-10 μm. A larger offset increases the angle of deflection of the sub-beam.

Figure 2:
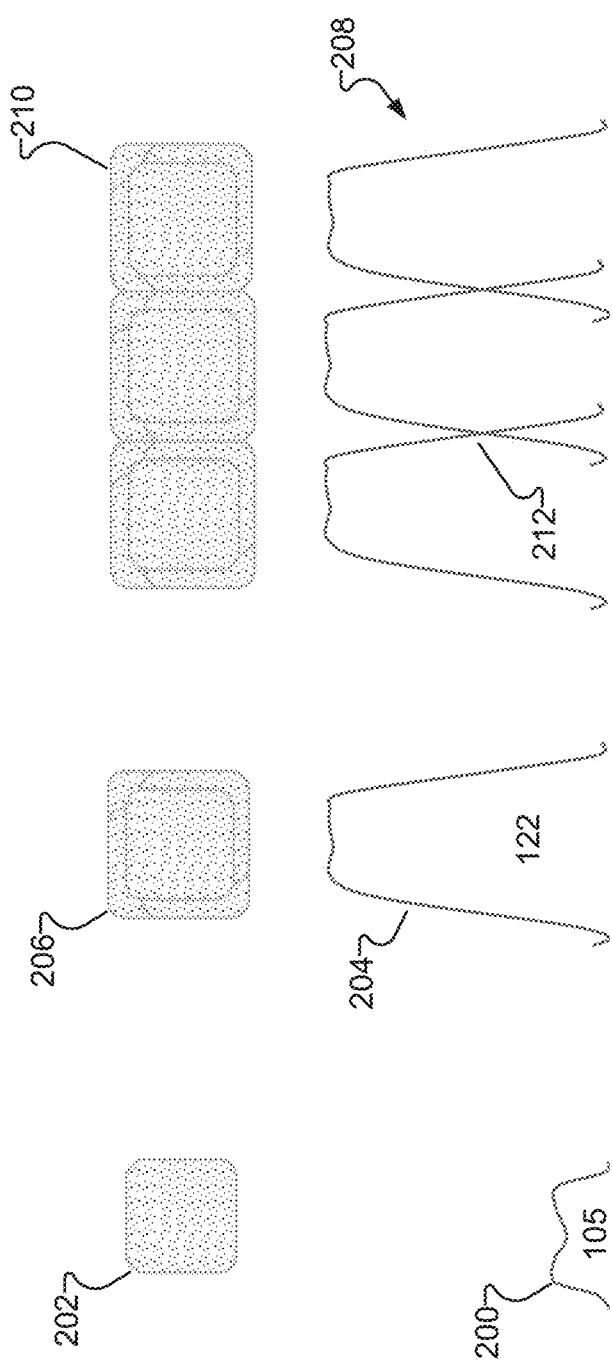
FIG. 2 is a diagram of profile and top views of beams.

Referring also to FIG. 2, in an example, the beam 105 emitted by a single light emitter 106 of the illumination device 100 has a tophat square beam profile 200, shown also from a top view 202. A single region 118 of the MLA 116 deflects light from its corresponding subset 120 of light emitters 106 to form the sub-beam 122, which has a profile 204 (shown also from a top view 206) with substantially uniform intensity and with little power variation across the width of the beam. The angle of deflection of the sub-beam 122a depends at least on the offset d between the region 118 of the MLA 116 and the corresponding subset 120 of light emitters 106.

The illumination beam 115 is formed by the combination of the multiple sub-beams 122a, 122b, 122c, each directed at a different angle of deflection. For instance, the sub-beams 122 can be deflected such that adjacent sub-beams 122 overlap at their FWHM point 212, forming the illumination beam 115. The illumination beam 115 is shown in profile 208 and from a top view 210. The formation of the illumination beam 115 from the multiple, differently deflected sub-beams 122 makes the illumination beam 115 a divergent beam, e.g., with a divergence at FWHM of about 20-180 degrees, e.g., about 50-90 degrees, e.g., about 60-70 degrees. The illumination beam can have a substantially uniform intensity with little power variation across the width of the beam, and can have a relatively steep rollover at edges of the beam.

Figure 3:
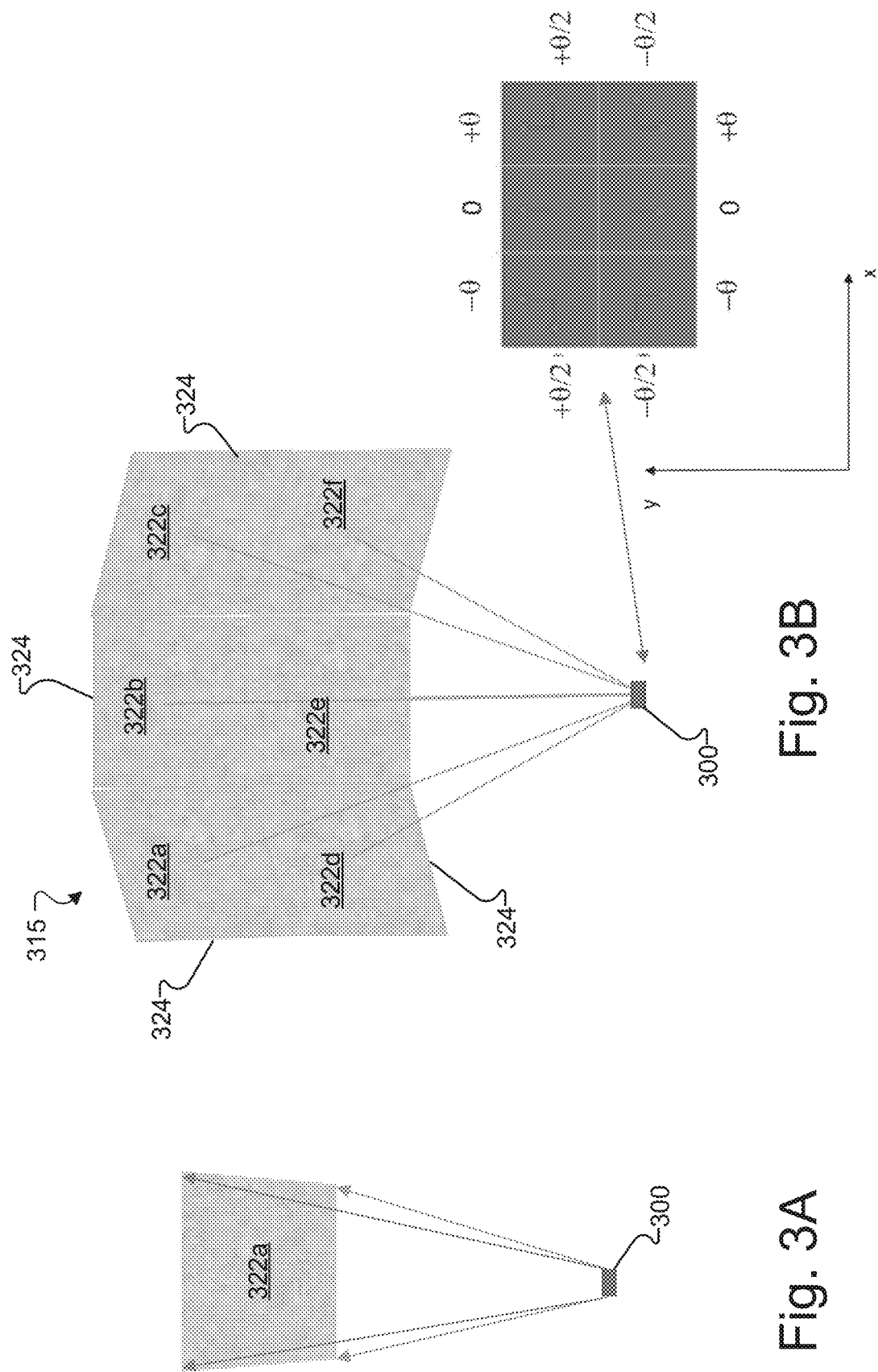
FIGS. 3A and 3B are diagrams of beams.

Referring to FIGS. 3A and 3B, in an example, an illumination device 300 has a two-dimensional MLA that is offset from a two-dimensional array of light emitters. A single region of the two-dimensional MLA deflects light from its corresponding subset of light emitters to form a sub-beam 322a. The sub-beam 322a is a relatively divergent beam with a substantially uniform intensity and little variation in power across the width of the sub-beam.

Multiple regions of the two-dimensional MLA each deflects light at a different angle of deflection, forming multiple sub-beams 322a-322f (collectively referred to as sub-beams 322). The sub-beams 322 combine to form an illumination beam 315, which is a divergent beam with a substantially uniform intensity and little variation in power across the width of the beam, and has a relatively steep rollover at edges 324 of the beam.

In the example of FIG. 3B, the illumination beam 315 is formed six sub-beams 322 in a 3×2 rectangular arrangement. To form such an illumination beam 315, the regions of the two-dimensional MLA are offset from their corresponding subsets of light emitters such that adjacent sub-beams overlap at their FWHM point. Specifically, the sub-beams 322 are offset in the y direction by an angle of either −θ/2 or +θ/2, and in the x direction by an angle of −θ, 0, or +θ, where θ is the divergence of each sub-beam 322.

Figure 4:
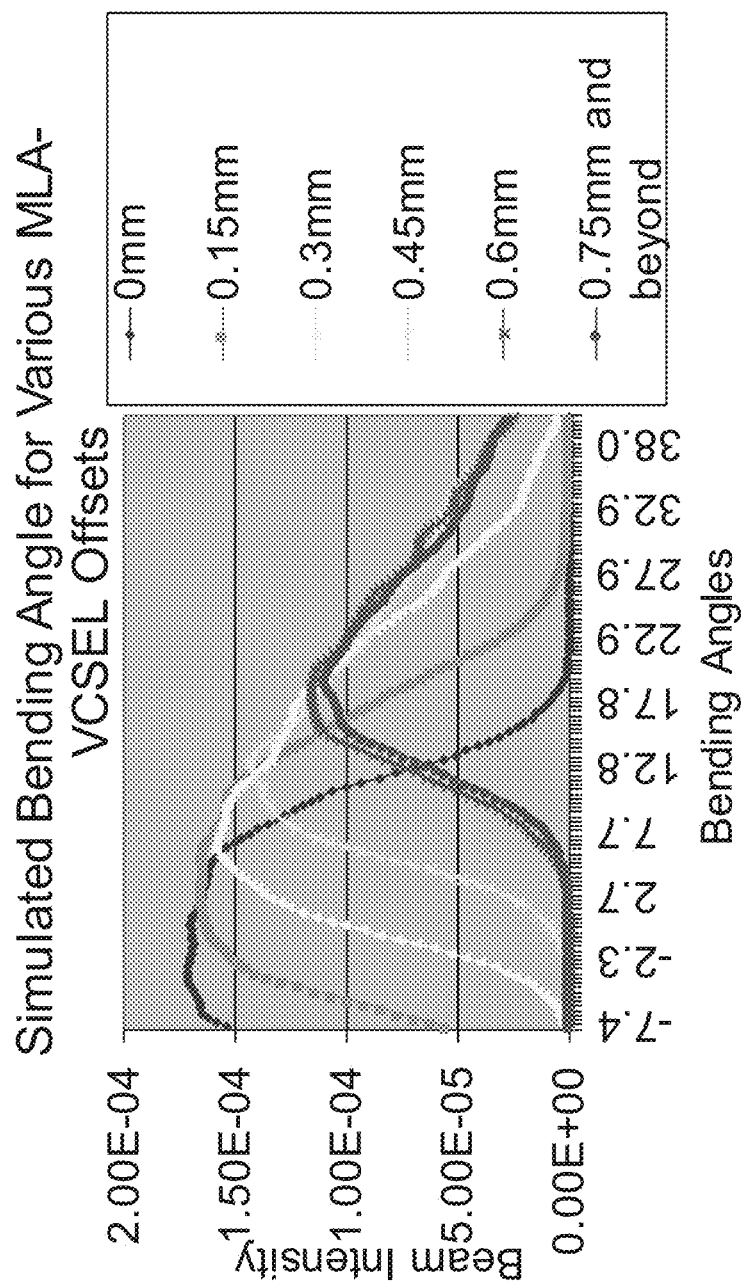
FIG. 4 is a plot of beam intensity versus deflection angle for various offsets.

Referring to FIG. 4, in a specific example, the intensity of an illumination beam emitted from a VCSEL array coupled to an MLA is shown relative to the bending angle (e.g., the angle of deflection) of the beam for various offsets between the VCSEL array and the MLA. As can be seen from FIG. 4, as the offset between the VCSEL array and the MLA increases, the peak intensity of the illumination beam shifts to larger bending angles, indicating the beam deflection caused by the offset.

Figures 5, 6:
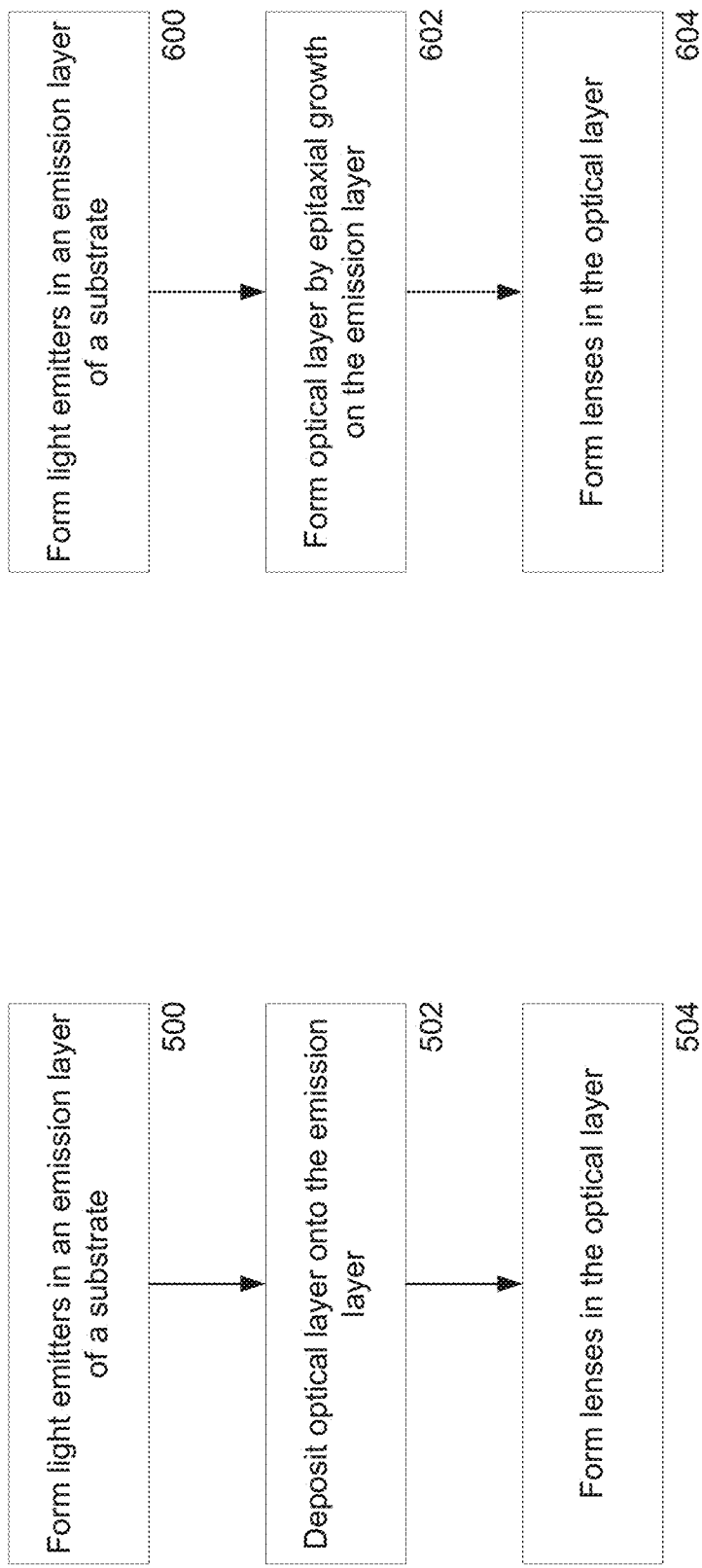
FIGS. 5 and 6 are flow charts.

FIG. 5 is a flow chart of a process for fabrication of an illumination device such as the illumination device 100 of FIG. 1, in which the optical layer is a thin film deposited onto the surface of the emission layer.

Light emitters, such as VCSELs, side emitting semiconductor lasers, laser diodes, or other types of light emitters, are formed in an emission layer of a substrate, such as a semiconductor substrate, e.g., a GaAs wafer (500). For instance, the emission layer can be a top layer of the substrate, and the light emitters can be formed by processing the substrate using semiconductor fabrication techniques, including thin film deposition, lithography, oxide growth, and etching processes. In some examples, at least a portion of the emission layer can be epitaxially grown onto the surface of the substrate.

The optical layer of the illumination device is formed by depositing a thin film of a transparent material onto the surface of the emission layer (502). The transparent material is a material that is transparent to the wavelength of light at which the light emitters are configured to emit light. In some examples, the thin film can be a polymer film deposited by a polymer thin film deposition technique, e.g., by spin coating, roll coating, plasma or vapor deposition, or other thin polymer film deposition technique. The polymer film can be cured after deposition. In some examples, the thin film can be an oxide film, such as a silicon oxide film, deposited by a thin film deposition technique such as plasma or vapor deposition. In some examples, the thin film can be processed following deposition to generate a flat surface. The thin film can have a thickness of less than 20 µm, e.g., less than 10 µm, e.g., between about 3 µm and about 8 µm.

Lenses are formed in the optical layer (504) using thin film patterning techniques. For instance, when the thin film is a polymer thin film, a layer of photoresist can be deposited onto the polymer thin film exposed in a pattern of squares or rectangles, with regions of the squares or rectangles being offset by a desired amount from the light emitters in the underlying emission layer. The exposed photoresist can be heated to melt the mesas into dome shapes, and the polymer film can be etched, e.g., by reactive ion etching, through the photoresist to form dome-shaped lenses. When the thin film is an oxide film, the lenses can be formed by a similar lithography and etching processes.

FIG. 6 is a flow chart of a process for fabrication of an illumination device such as the illumination device 100 of FIG. 1, in which the optical layer is an epitaxially grown layer, e.g., a layer of a semiconductor such as GaAs, AlGaAs, or another semiconductor, that is epitaxially grown onto the emission layer.

Light emitters, such as VCSELs, side emitting semiconductor lasers, laser diodes, or other types of light emitters, are formed in an emission layer of a substrate, such as a semiconductor substrate, e.g., a GaAs wafer (600) using semiconductor fabrication techniques.

The optical layer of the illumination device is formed by epitaxial growth of a transparent material on the surface of the emission layer (602). The transparent material is a material that is transparent to the wavelength of light at which the light emitters are configured to emit light. For instance, the transparent material can be an epitaxial layer of GaAs or AlGaAs. The epitaxial layer can have a thickness of less than about 25 µm, e.g., less than about 20 µm, e.g., between about 10 µm and about 20 µm.

Lenses are formed in the epitaxial optical layer (604) using semiconductor fabrication processes including lithography and etching as described above for polymer or oxide layers. For instance, the lenses can be positioned at desired offsets from the light emitters of the underlying emission layer.

An illumination device having an epitaxially grown optical layer can be resistant to moisture or chemical damage, improving the reliability of the illumination device. In some examples, epitaxially grown layers can be formed of materials with relatively high refractive indices; an MLA formed in an epitaxially grown optical layer can effect a large angle of deflection, thereby producing an illumination beam with a wide divergence.

Referring to FIG. 7, in an example illumination device 700, an array 714 of light emitters are formed in an emission layer 704 on a front side 730 of a substrate 708. An optical layer 710 includes an MLA 716. The MLA 716 is formed on a back side 732 of the substrate 708 and is offset from the array 714 of light emitters as described with respect to the illumination device of FIG. 1.

In the illumination device 700, the substrate 708 itself forms part of the optical layer 710. The substrate 708 is formed of a material that is transparent to light 705 emitted from the light emitters. For instance, for light emitters emitting light at a wavelength of at least about 950 nm, the substrate 708 can be GaAs. The light 705 emitted from the light emitters is transmitted through the substrate 708 to the MLA 716, and an illumination beam 715 composed of multiple sub-beams 722, each with a different angle of deflection, exits from the back side 732 of the substrate 708.

An illumination device such as the illumination device 700, in which the light emitters and MLA are formed on opposite sides of the substrate, can be resistant to moisture or chemical damage, improving the reliability of the illumination device. In some examples, semiconductor substrates can have relatively high refractive indices; an MLA formed on the back side of such a substrate can effect a large angle of deflection, thereby producing an illumination beam with a wide divergence.

FIG. 8 is a flow chart of a process for fabrication of an illumination device such as the illumination device 700 of FIG. 7, in which the light emitters and MLA are formed on opposite sides of the substrate.

Light emitters, such as VCSELs, side emitting semiconductor lasers, laser diodes, or other types of light emitters, are formed in an emission layer on a front surface of a substrate, such as a semiconductor substrate, e.g., a GaAs substrate (800), using semiconductor fabrication techniques.

Lenses are formed on a back surface of the substrate (802). In some examples, the lenses can be formed by depositing and patterning a polymer thin film or an oxide thin film. In some examples, the lenses can be formed in an epitaxially grown thin film on the back surface of the substrate. In some examples, the lenses can be formed directly on the back surface of the substrate, without growth or deposition of an additional layer. The lenses can be positioned at desired offsets from the light emitters of the underlying emission layer.

Figure 9:
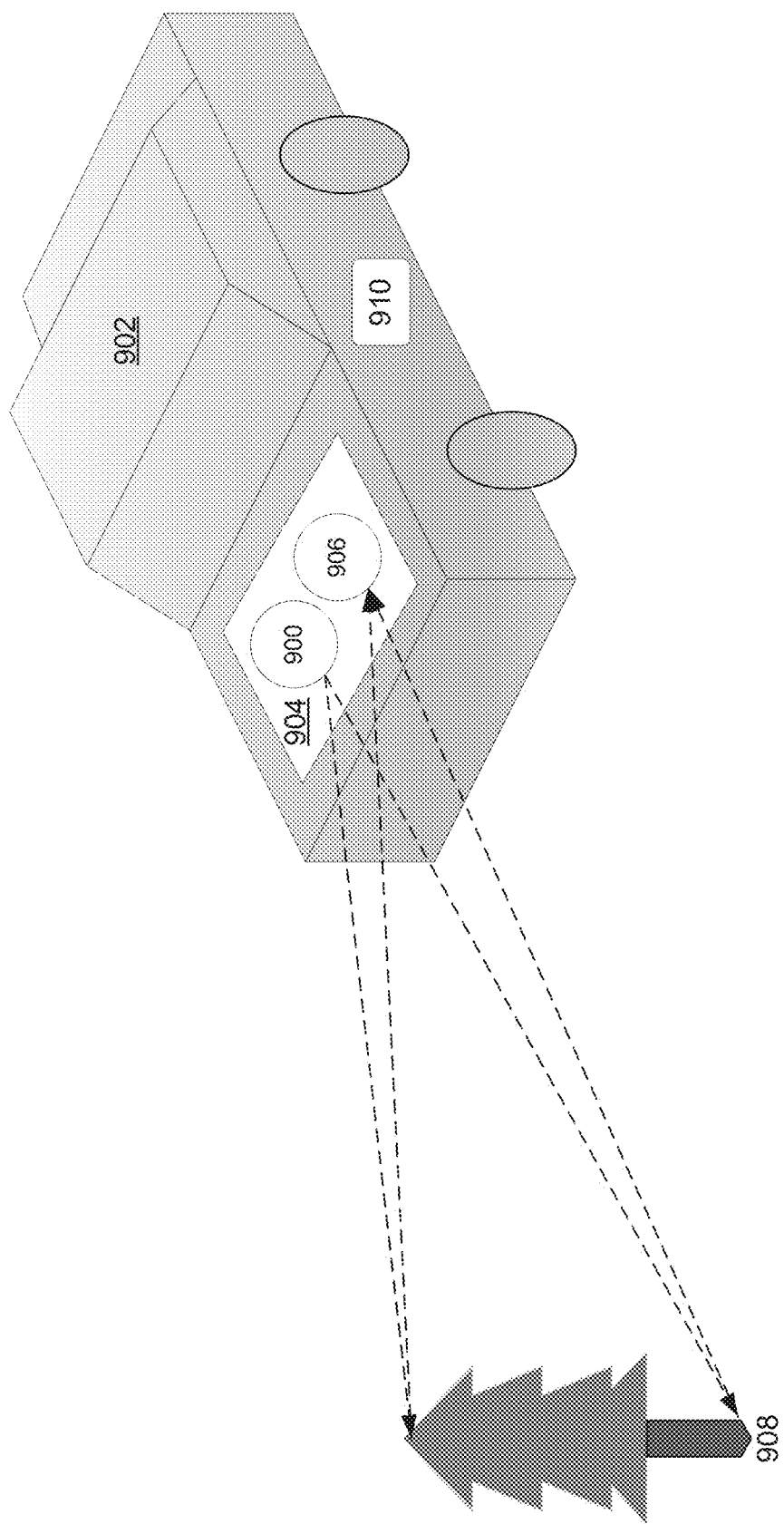
FIG. 9 is a diagram of a vehicle.

Referring to FIG. 9, in some examples, an illumination device 900 such as those described above can be mounted on a vehicle 902, such as a partially-autonomous or fully-autonomous vehicle. The vehicle can be a land-based vehicle (as shown), such as a car or truck; an aerial vehicle, such as an unmanned aerial vehicle; or a water-based vehicle, such as a ship or submarine. The illumination device 900 can be a flood illuminator. In the context of the partially- or fully-autonomous vehicle 902, the illumination device 900 can form part of a remote imaging system 904, such as a LIDAR (Light Detection and Ranging) system, that includes imaging components such as a sensor 906, e.g., a camera, mirror, or scanner. The imaging system 904 including the illumination device 900 can be used, e.g., for three-dimensional (3-D) mapping of the environment of the vehicle 902. For instance, the illumination device 900 can be used to illuminate an object 908, e.g., an object in or near a roadway on which the vehicle 902 is traveling, and the sensor 906 can be used to capture light reflected by the illuminated object 908. A signal based on the reflected light (e.g., a signal generated by a photodetector such as a photodiode) can be provided to a computing device 910, e.g., including one or more processors, that determines a 3-D shape of the object based on the reflected light. By determining the 3-D shapes of various objects, a mapping of an environment of the vehicle can be determined and used to control the partially- or fully-autonomous operation of the vehicle 902.

Referring to FIG. 10A, in some examples, an illumination device 150 such as those described above can be mounted on or incorporated into a front side of a mobile computing device 152, such as a mobile phone, a tablet, or a wearable computing device. The front side of the mobile device 152 is the side of the device that includes a screen 156. The illumination device 150 can be a flood illuminator. The illumination device 150 can be incorporated into a front-side imaging system 158 that includes imaging components such as a sensor 160, e.g., a camera, mirror, or scanner. The front-side imaging system 158 including the illumination device 150 can be used for 3-D imaging applications, e.g., for facial recognition. For instance, the structured light illumination device 150 can be used to illuminate a face 162 of a person, and the sensor 160 can be used to capture light reflected by the face 162. A signal based on the reflected light (e.g., a signal generated by a photodetector such as a photodiode) can be provided to one or more processors 164, e.g., in the mobile device 152 or remote, such as cloud-based processors. The one or more processors 164 can perform facial recognition processing based on the light reflected by the face 162.

Figure 10B:
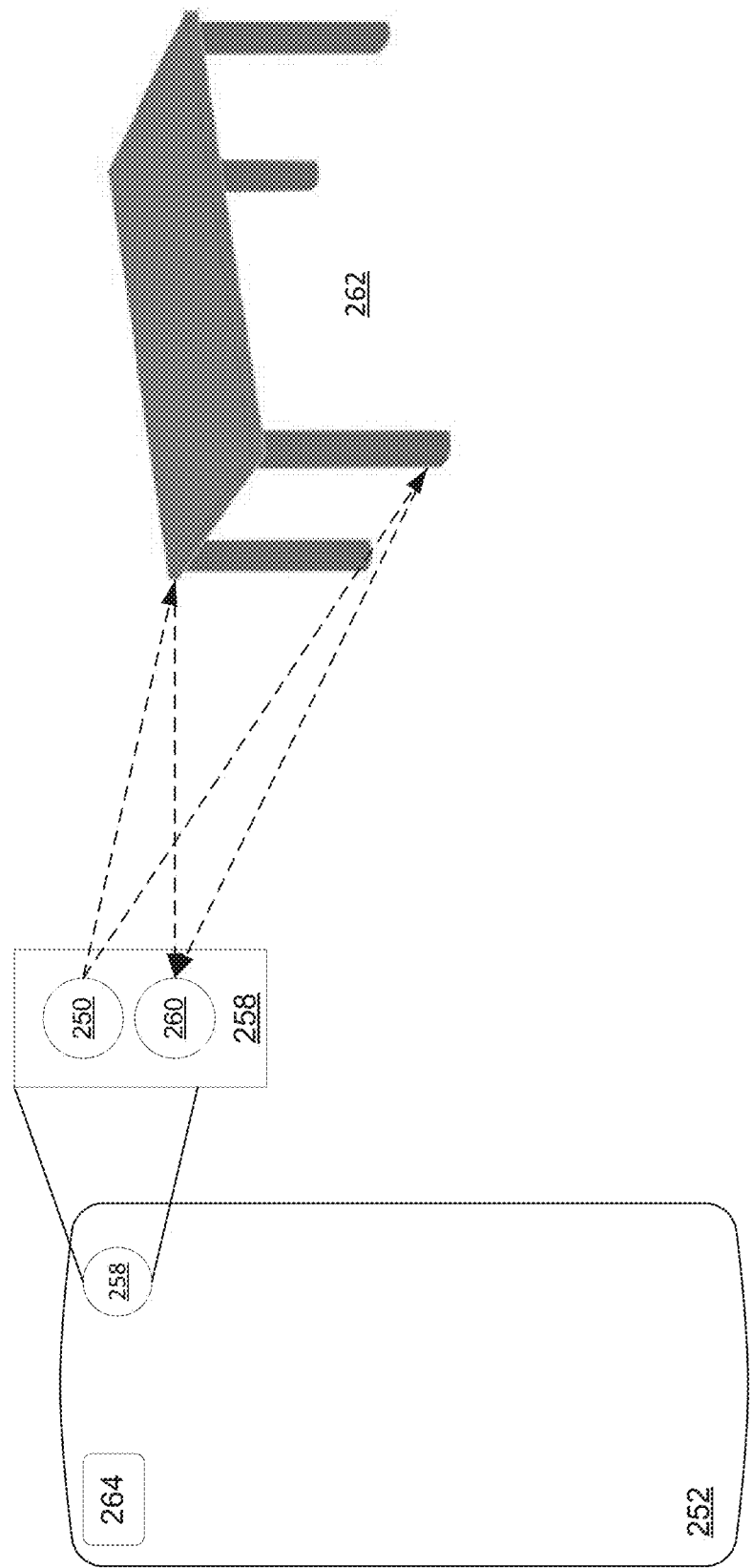

Referring to FIG. 10B, in some examples, an illumination device 250 such as those described above can be mounted on a back side of a mobile computing device 252. The back side is the side of the device opposite the front side, such as the side that does not include a screen. The illumination device 250 can be a flood illuminator. The illumination device 250 can be incorporated into a back-side imaging system 258 that includes imaging components such as a sensor 260, e.g., a camera, mirror, or scanner. The back-side imaging system 258 including the illumination device 250 can be used, e.g., for 3-D imaging applications, e.g., for object recognition or for environmental mapping, such as mapping of a room. For instance, the illumination device 250 can be used to illuminate an object 262 in a room or other environment, and the sensor 260 can be used to capture light reflected by the object 262. A signal based on the reflected light (e.g., a signal generated by a photodetector such as a photodiode) can be provided to one or more processors 264, e.g., in the mobile device 252 or remote, such as cloud-based processors. The one or more processors 264 can determine a 3-D shape of the object based on the reflected light. The determined 3-D shape can be used by the one or more processors 264 to perform object recognition processing, or can be used in combination with determined 3-D shapes of one or more other objects to develop a 3-D mapping of the room.

An illumination device such as those described above can further be used to generate an illumination beam for generating time-of-flight data. In this example, the MLA is arranged such that the illumination beam has a larger intensity around the periphery of the illuminated area. The larger intensity can be achieved by covering a larger number of light emitters by those lenses which direct the light towards the periphery than the light emitters covered by lenses which direct the light towards the centre of the illuminated area. Instead of, or in addition to, using a larger number of emitters to achieve a higher intensity, individual emitters with a higher intensity of emitted light can be used. Other non-uniform beam intensity profiles can be achieved by arranging the MLA accordingly.

The illumination device such as described above comprises a plurality of light emitters which can be controlled independently. Different parts of the array, or even individual light emitters can be switched on or off selectively and independent from other parts of the array or independent from other individual light emitters. Different parts of a target illumination area can thereby be illuminated selectively.

The device illustrated in FIGS. 1A and 1B comprises different subsets of micro-lens arrays. The offset between the micro-lenses with respect to the central light emitting axis of the light emitters is the same within each subset, such as within subsets 120a, 120b and 120c, but different between those different subsets. In an alternative device, a particular offset is duplicated at least once across the substrate outside the initial subset. For example, the substrate of FIG. 1A with three subsets can instead be arranged as a substrate with six subsets, formed by duplicating the initial three subsets adjacent a first set of three subsets. Alternatively, the three types of offsets illustrated in FIG. 1A can be distributed randomly, quasi-randomly, or periodically. The advantage of distributing particular offsets outside a single subset is that the overall light output is more robust against damage such as scratching or dirt. If a piece of dust occludes one of the MLA subsets in the FIG. 1A device, then the portion of the illumination beam corresponding to that MLA subset will be obstructed thereby causing a non-uniform reduction in illumination beam intensity. However, in the alternative device where the offsets are distributed more evenly, then a piece of dust would only cause a uniform reduction of intensity, or at least more uniform than the FIG. 1A device.

The devices discussed previously comprise an emitter array, such as array 114, whereby the distance between emitters in the emitter array is constant with micro-lenses which are offset with respect to the central light emitting axis of the emitters. Alternatively, the micro-lenses can be distributed uniformly, while the emitters are offset with respect to the central optical axis of the micro-lenses. Alternatively, both the emitter array and the micro-lens array have an array spacing which is not constant, while the relative offset between the central light emitting axis of each emitter relative to the optical axis of each micro-lens is chosen to achieve the desired beam profile.

Figure 11:
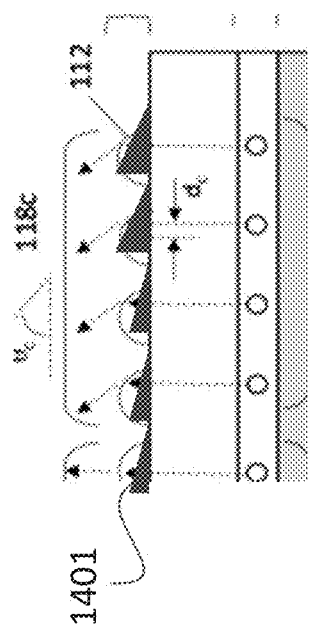
FIG. 11 is an illustration of an illumination device.

FIG. 11 illustrates an embodiment of the invention. In the examples described above by way of background, an array of micro-lenses is used. In the embodiment, instead of the array of micro-lenses, an array of micro-prisms is used. The expression 'micro-prisms' is used to indicate that the prisms have dimensions similar to the dimensions of the emitters such as VCSELs. The light emitted by the emitters enters the micro-prisms through a first surface of the prisms and exits the prisms through an opposite surface at an angle larger than 0 with respect to the emission direction of the emitters. The light is refracted at the interfaces formed by the first and second surfaces. The refraction is determined by the relative refractive indices of the prism material and the adjacent material, as well as the angle between the prism surfaces. In an embodiment, different prims have different angles between the surfaces, such that the light is refracted in different directions. An advantage of using prisms is that the position of the prisms in the plane perpendicular to the main emission axis of the light emitters is not critical as long as the light enters the prism. The prisms can also be large enough to cover a plurality of adjacent emitters, in which case the light from each of the plurality of adjacent emitters is refracted in the same direction. FIG. 11 illustrates an embodiment with a single prism 1401 arranged for each emitter. Each of the beam shaping examples discussed previously in connection with micro-lenses can also be achieved with the micro-prisms. This embodiment is preferably implemented with back-side illuminated VSCEL arrays.

Figure 12A:
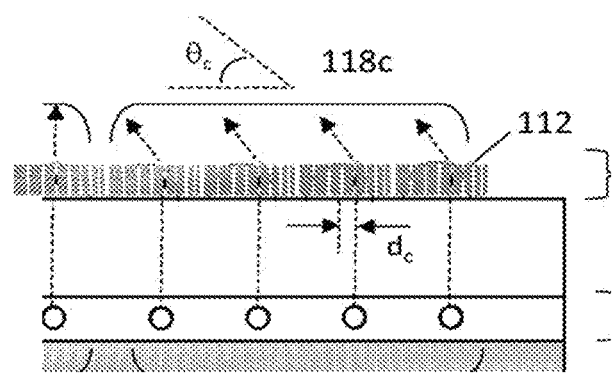
FIGS. 12A and 12B are illustrations of an illumination device.
Figure 12B:
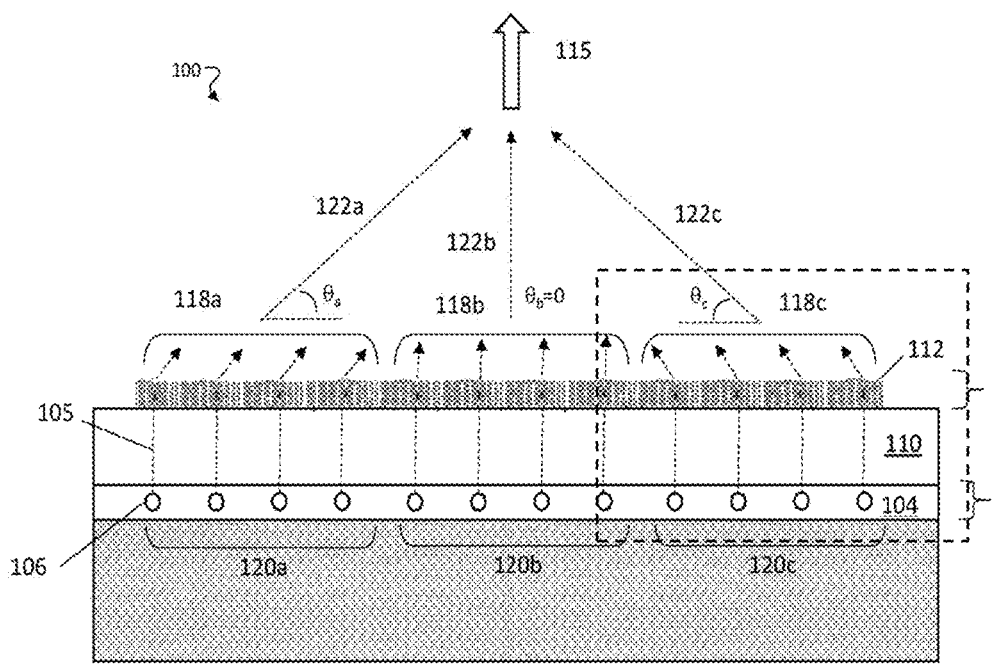

FIGS. 12A and 12B illustrates a similar arrangement as shown in FIG. 11, but the prisms are replaced by meta-structures, also referred to as meta-surfaces, which achieve the same optical effect as the prisms. The excerpted view of FIG. 12A corresponds to the portion of FIG. 12B indicated by an inset dashed box. In some embodiments, each of the meta-structures at least partially overlaps a corresponding one of the light emitters. In some embodiments, each of the meta-structures at least partially overlaps multiple corresponding light emitters. The meta-surfaces can be formed in a GaAs substrate or a Si layer on the GaAs substrate. The phase function can be encoded in the meta-surface with high accuracy. Meta-surfaces are nanostructured interfaces with a thickness smaller than the wavelength of the emitted light and whereby a spatial arrangement of meta-structures achieves the prism effect. It is known to the skilled person how to manufacture a meta-surface which has the optical properties of a lens or a prism.

The invention can also be described by the following numbered clauses:

Clause 1: A device comprising: an illumination device for emitting an illumination beam, the illumination device comprising: an emitter array comprising multiple light emitters; and a micro-lens array (MLA) comprising multiple micro-lenses, the MLA being positioned to receive light emitted from the emitter array, in which light from the MLA forms the illumination beam, in which a first region of the MLA is offset from the emitter array by a first offset amount, and a second region of the MLA is offset from the emitter array by a second offset amount different than the first offset amount.

Clause 2. The device of clause 1, in which the light emitters comprise vertical cavity surface emitting lasers (VCSELs).

Clause 3. The device of any of the preceding clauses, comprising: a substrate, the emitter array being formed in an emission layer of the substrate; and an optical layer disposed on the substrate, the MLA being formed in the optical layer.

Clause 4. The device of clause 3, in which the optical layer is disposed on the emission layer of the substrate.

Clause 5. The device of clause 3 or 4, in which the optical layer comprises an epitaxial semiconductor.

Clause 6. The device of any of clauses 3 to 5, in which the optical layer comprises a polymer film.

Clause 7. The device of any of clauses 3 to 6, in which the emission layer is on a first surface of the substrate, and in which the optical layer is disposed on a second surface of the substrate opposite the first surface.

Clause 8. The device of clause 7, in which the substrate is at least partially transparent to the light emitted from the emitter array.

Clause 9. The device of any of clauses 3 to 8, in which the optical layer has a refractive index of at least 1.5.

Clause 10. The device of any of the preceding clauses, in which each light emitter emits a single beam of light, and in which a divergence of the illumination beam is greater than a divergence of each of the single beams of light emitted from the light emitters.

Clause 11. The device of clause 10, in which the divergence of the illumination beam is between about 20° and about 180°.

Clause 12. The device of clause 11, in which the divergence of the illumination beam is between about 60° and about 70°.

Clause 13. The device of any of clauses 10 to 12, in which the divergence of the illumination beam in a first direction is different than the divergence of the illumination beam in a second direction.

Clause 14. The device of clause 13, in which the divergence of the illumination beam in the first direction is between about 50° and about 60° and the divergence of the illumination beam in the second direction is between about 60° and about 70°.

Clause 15. The device of any of the preceding clauses, in which each of the micro-lenses at least partially overlaps a corresponding one of the light emitters.

Clause 16. The device of clause 15, in which each of the micro-lenses at least partially overlaps multiple corresponding light emitters.

Clause 17. The device of any of the preceding clauses, in which at least one of the micro-lenses is configured to deflect the light received from a corresponding light emitters.

Clause 18. The device of any of the preceding clauses, in which each region of the MLA is positioned to receive light from a corresponding subset of the light emitters and to output a corresponding sub-beam, a first sub-beam output from the first region of the MLA having a different angle of deflection than a second sub-beam output from the second region of the MLA.

Clause 19. The device of clause 18, in which the first and second regions of the MLA are positioned such that the first sub-beam overlaps with the second sub-beam at the full width at half maximum (FWHM) points of the first and second sub-beams.

Clause 20. The device of any of the preceding clauses, in which the illumination device comprises an illumination device of a mobile computing device.

Clause 21. The device of any of the preceding clauses, in which the illumination device comprises a LIDAR device.

Clause 22. The device of clause 21, in which the device comprises a vehicle and the illumination device comprises a LIDAR device for the vehicle.

Clause 23. The device of clause 21 or 22, in which the LIDAR device comprises a component of a three-dimensional mapping system.

Clause 24. A method of making an illumination device, comprising: forming an emitter array in an emission layer of a substrate, the emitter array comprising multiple light emitters; and forming an optical layer on the substrate, including forming an MLA comprising multiple micro-lenses in the optical layer, in which forming the MLA includes forming the MLA such that a first region of the MLA is offset from the emitter array by a first offset amount, and a second region of the MLA is offset from the emitter array by a second offset amount different than the first offset amount.

Clause 25. The method of clause 24, in which forming the optical layer on the substrate comprises: depositing the optical layer on the substrate; and forming the MLA in the deposited optical layer.

Clause 26. The method of clause 25, in which depositing the optical layer on the substrate comprises depositing a polymer film on the substrate.

Clause 27. The method of clause 26, in which depositing a polymer film on the substrate comprises depositing a polymer film having a refractive index of at least 1.5.

Clause 28. The method of any of clauses 24 to 27, in which forming the optical layer on the substrate comprises: epitaxially growing the optical layer on the substrate; and forming the MLA in the epitaxially grown optical layer.

Clause 29. The method of any of clauses 24 to 28, in which forming the optical layer on the substrate comprises forming the optical layer on the emission layer of the substrate.

Clause 30. The method of any of clauses 24 to 29, in which the emission layer is on a first surface of the substrate, and in which forming the optical layer on the substrate comprises forming the optical layer on a second surface of the substrate opposite the first surface.

Clause 31. The method of any of clauses 24 to 30, in which forming the MLA comprises forming the MLA such that each of the micro-lenses at least partially overlaps a corresponding one of the light emitters.

Clause 32. The method of any of clauses 24 to 31, in which forming the emitter array and the MLA comprise forming the emitter array and the MLA using semiconductor fabrication processes.

Clause 33. A method for producing an illumination beam, comprising: emitting light from each of multiple light emitters in an emitter array; at a first region of an MLA comprising multiple micro-lenses, receiving light from a first subset of the light emitters and outputting a first sub-beam having a first angle of deflection; at a second region of the MLA, receiving light from a second subset of the light emitters and outputting a second sub-beam having a second angle of deflection different from the first angle of deflection; and combining the first sub-beam and the second sub-beam to produce the illumination beam.

Clause 34. The method of clause 33, in which each light emitter emits a single beam of light, and in which a divergence of the illumination beam is greater than a divergence of each of the single beams of light emitted from the light emitters.

Clause 35. The method of clause 34, in which the divergence of the illumination beam is between about 20° and about 180°.

Clause 36. The device of clause 34 or 35, in which the divergence of the illumination beam in a first direction is different than the divergence of the illumination beam in a second direction.

Clause 37. The method of any of clauses 33 to 36, in which the illumination beam comprises an illumination beam of a mobile computing device.

Clause 38. The method of any of clauses 33 to 37, in which the illumination beam comprises an illumination beam of a LIDAR device.

Clause 39. A 3-D imaging system comprising: an illumination device in accordance with any one of clauses 1 to 30, the illumination device being configured to illuminate an object with a pattern of light; a sensor configured to receive reflected light from the illuminated object; and one or more computing devices configured to determine a 3-D shape of the object based on the reflected light.

Clause 40. The 3-D imaging system of clause 39, in which the sensor comprises a camera.

Clause 41. The 3-D imaging system of clause 39 or 40, in which the one or more computing devices are configured to determine a 3-D mapping of an area based on the reflected light.

Clause 42. The 3-D imaging system of any of clauses 39 to 41, in which the one or more computing devices are configured to perform a facial recognition process based on the determined 3-D shape of the object.

A number of embodiments have been described. Nevertheless, it will be understood that various modifications may be made without departing from the scope of the invention. For example, some of the steps described above may be order independent, and thus can be performed in an order different from that described.

Other implementations are also within the scope of the following claims.

What is claimed is:

1. A device comprising:
an illumination device for emitting an illumination beam, the illumination device comprising:
an emitter array comprising multiple light emitters;
and a meta-structure array comprising multiple transmission areas, the meta-structure array being positioned to receive light emitted from the emitter array,
in which light from the meta-structure array forms the illumination beam, in which a first one of said multiple transmission areas is arranged to emit light in a different direction than a second one of said multiple transmission areas,
in which each meta-structure of the meta-structure array at least partially overlaps multiple corresponding light emitters,
in which each transmission area of the meta-structure array is positioned to receive light from a corresponding subset of the light emitters and to output a corresponding sub-beam of the illumination beam, a first sub-beam output from the first transmission area of the meta-structure array having a different angle of deflection than a second sub-beam output from the second transmission area of the meta-structure array,
in which the first and second transmission areas of the meta-structure array are adjacent to each other and are positioned such that the first sub-beam overlaps with the second sub-beam at the full width at half maximum (FWHM) points of the first and second sub-beams.

2. The device of claim 1, in which the light emitters comprise vertical cavity surface emitting lasers (VCSELs).

3. The device of claim 1, comprising:
a substrate, the emitter array being formed in an emission layer of the substrate; and
an optical layer disposed on the substrate, the meta-structure array being formed in the optical layer.

4. The device of claim 3, in which the optical layer is disposed on the emission layer of the substrate.

5. The device of claim 3, in which the optical layer comprises an epitaxial semiconductor.

6. The device of claim 3, in which the optical layer comprises a polymer film.

7. The device of claim 3, in which the emission layer is on a first surface of the substrate, and in which the optical layer is disposed on a second surface of the substrate opposite the first surface.

8. The device of claim 7, in which the substrate is at least partially transparent to the light emitted from the emitter array.

9. The device of claim 3, in which the optical layer has a refractive index of at least 1.5.

10. The device of claim 1, in which each light emitter emits a single beam of light, and in which a divergence of the illumination beam is greater than a divergence of each of the single beams of light emitted from the light emitters.

11. The device of claim 10, in which the divergence of the illumination beam is between about 20° and about 180°.

12. The device of claim 11, in which the divergence of the illumination beam is between about 60° and about 70°.

13. The device of claim 10, in which the divergence of the illumination beam in a first direction is different than the divergence of the illumination beam in a second direction.

14. The device of claim 13, in which the divergence of the illumination beam in the first direction is between about 50° and about 60° and the divergence of the illumination beam in the second direction is between about 60° and about 70°.

15. The device of claim 1, in which the illumination device comprises an illumination device of a mobile computing device.

16. The device of claim 1, in which the illumination device comprises a LIDAR device.

17. The device of claim 16, in which the device comprises a vehicle and the illumination device comprises a LIDAR device for the vehicle.

18. The device of claim 16, in which the LIDAR device comprises a component of a three-dimensional mapping system.

19. The device of claim 1, in which each meta-structure of the meta-structure array corresponds to one transmission area of said multiple transmission areas and in which each transmission area of said multiple transmission areas is arranged to emit light in a single direction and different than any other transmission area of said multiple transmission areas.

20. The device of claim 19, in which each meta-structure of the meta-structure array at least partially overlaps multiple corresponding light emitters along a width of the respective meta-structure.

21. The device of claim 1, in which said multiple transmission areas comprises six transmission areas disposed in a rectangular arrangement to output six sub-beams, each sub-beam overlapping adjacent sub-beams at their FWHM point, each sub-beam having a same divergence and each sub-beam having a different angle of deflection determined as a factor of the divergence.

22. The device of claim 1, in which a third one of said multiple transmission areas is arranged to emit light in a different direction than the first and the second transmission areas, a third sub-beam output from the third transmission area having a different angle of deflection that the first and second sub-beams, in which the second and third transmission areas of the meta-structure array are adjacent to each other and are positioned such that the second sub-beam overlaps with the third sub-beam at the full width at half maximum (FWHM) points of the second and third sub-beams.

23. The device of claim 22, in which each transmission area of the multiple transmission areas is configured to output a sub-beam having one of a first, second or third deflection angle, in which the multiple transmission areas are distributed randomly, quasi-randomly, or periodically.

24. A method of making an illumination device, comprising:
forming an emitter array in an emission layer of a substrate, the emitter array comprising multiple light emitters; and
forming an optical layer on the substrate, including forming a meta-structure array in the optical layer, the meta-structure array comprising multiple transmission areas,
in which a first one of said multiple transmission areas is arranged to emit light in a different direction than a second one of said multiple transmission areas,
in which each meta-structure of the meta-structure array at least partially overlaps multiple corresponding light emitters,
in which each transmission area of the meta-structure array is positioned to receive light from a corresponding subset of the light emitters and to output a corresponding sub-beam of the illumination beam, a first sub-beam output from the first transmission area of the meta-structure array having a different angle of deflection than a second sub-beam output from the second transmission area of the meta-structure array,
in which the first and second transmission areas of the meta-structure array are adjacent to each other and are positioned such that the first sub-beam overlaps with the second sub-beam at the full width at half maximum (FWHM) points of the first and second sub-beams.

25. The method of claim 24, in which forming the optical layer on the substrate comprises: depositing the optical layer on the substrate; and forming the meta-structure array in the deposited optical layer.

26. The method of claim 25, in which depositing the optical layer on the substrate comprises depositing a polymer film on the substrate.

27. The method of claim 26, in which depositing a polymer film on the substrate comprises depositing a polymer film having a refractive index of at least 1.5.

28. The method of claim 24, in which forming the optical layer on the substrate comprises: epitaxially growing the optical layer on the substrate; and forming the meta-structure array in the epitaxially grown optical layer.

29. The method of claim 24, in which forming the optical layer on the substrate comprises forming the optical layer on the emission layer of the substrate.

30. The method of claim 24, in which the emission layer is on a first surface of the substrate, and in which forming the optical layer on the substrate comprises forming the optical layer on a second surface of the substrate opposite the first surface.

31. The method of claim 24, in which forming the emitter array and the meta-structure array comprise forming the emitter array and the meta-structure array using semiconductor fabrication processes.

32. The method of claim 24, in which forming the meta-structure array comprises forming the meta-structure array such that each meta-structure of the meta-structure array corresponds to one transmission area of said multiple transmission areas, and each transmission area of said multiple transmission areas is arranged to emit light in a single direction and different than any other transmission area of said multiple transmission areas, and each meta-structure of the meta-structure or array at least partially overlaps multiple corresponding light emitters along a width of the respective meta-structure.

33. A method for producing an illumination beam, comprising:
emitting light from each of multiple light emitters in an emitter array;
at a first meta-structure corresponding to a first region of an array of meta-structures, receiving light from a first subset of the light emitters and outputting a first sub-beam having a first angle of deflection;
at a second meta-structure corresponding to a second region of the array of meta-structures, receiving light from a second subset of the light emitters and outputting a second sub-beam having a second angle of deflection different from the first angle of deflection; and
combining the first sub-beam and the second sub-beam to produce the illumination beam, in which each meta-structure of the meta-structure array at least partially overlaps multiple corresponding light emitters,
in which the first and second regions of the array of meta-structures are adjacent to each other and are positioned such that the first sub-beam overlaps with the second sub-beam at the full width at half maximum (FWHM) points of the first and second sub-beams.

34. The method of claim 33, in which each light emitter emits a single beam of light, and in which a divergence of the illumination beam is greater than a divergence of each of the single beams of light emitted from the light emitters.

35. The method of claim 34, in which the divergence of the illumination beam is between about 20° and about 180°.

36. The device of claim 34, in which the divergence of the illumination beam in a first direction is different than the divergence of the illumination beam in a second direction.

37. The method of claim 33, in which the illumination beam comprises an illumination beam of a mobile computing device.

38. The method of claim 33, in which the illumination beam comprises an illumination beam of a LIDAR device.

39. A 3-D imaging system comprising:
an illumination device in accordance with claim 1, the illumination device being configured to illuminate an object with a pattern of light;
a sensor configured to receive reflected light from the illuminated object; and
one or more computing devices configured to determine a 3-D shape of the object based on the reflected light.

40. The 3-D imaging system of claim 39, in which the sensor comprises a camera.

41. The 3-D imaging system of claim 39, in which the one or more computing devices are configured to determine a 3-D mapping of an area based on the reflected light.

42. The 3-D imaging system of claim 39, in which the one or more computing devices are configured to perform a facial recognition process based on the determined 3-D shape of the object.

* * * * *